(12) United States Patent
Yang

(10) Patent No.: US 7,563,690 B2
(45) Date of Patent: Jul. 21, 2009

(54) METHOD FOR FORMING SHALLOW TRENCH ISOLATION REGION

(75) Inventor: Chin Cheng Yang, Hsinchu (TW)

(73) Assignee: Macronix International Co., Ltd. (TW)

( * ) Notice: Subject to any disclaimer, the term of this patent is extended or adjusted under 35 U.S.C. 154(b) by 214 days.

(21) Appl. No.: 11/277,678

(22) Filed: Mar. 28, 2006

(65) Prior Publication Data
US 2007/0238260 A1 Oct. 11, 2007

(51) Int. Cl.
*H01L 21/76* (2006.01)
(52) U.S. Cl. .............. 438/435; 438/424; 257/E21.546
(58) Field of Classification Search .......... 438/424, 438/435; 257/E21.546
See application file for complete search history.

(56) References Cited
U.S. PATENT DOCUMENTS

| | | | | |
|---|---|---|---|---|
| 3,615,951 A | * | 10/1971 | Franco et al. | 216/17 |
| 5,316,965 A | * | 5/1994 | Philipossian et al. | 438/424 |
| 6,180,493 B1 | | 1/2001 | Chu | |
| 6,358,859 B1 | * | 3/2002 | Lo et al. | 438/712 |
| 2003/0030076 A1 | * | 2/2003 | Park | 257/207 |
| 2005/0079730 A1 | * | 4/2005 | Beintner et al. | 438/758 |
| 2006/0079068 A1 | * | 4/2006 | Sheu et al. | 438/433 |
| 2007/0032039 A1 | * | 2/2007 | Chen et al. | 438/435 |

* cited by examiner

*Primary Examiner*—Bradley K Smith
(74) *Attorney, Agent, or Firm*—Baker & McKenzie LLP

(57) ABSTRACT

A method for forming a shallow trench isolation (STI) structure is provided. A pad oxide layer and a nitride silicon layer are formed on a provided substrate sequentially. The pad oxide layer, the nitride silicon layer and the substrate are then etched to form a trench. An oxide liner and a nitride liner are formed in the trench. A self-align photo process is implemented and the nitride liner is then etched to expose the oxide liner.

14 Claims, 4 Drawing Sheets

METHOD FOR FORMING SHALLOW TRENCH ISOLATION REGION

BACKGROUND OF THE INVENTION

1. Field of the Invention

The present invention generally relates to a method for forming a shallow trench isolation region and, more particularly, to a method for forming a shallow trench isolation region by a nitride liner pull back process.

2. Description of the Related Art

During fabrication of integrated circuits devices are formed on a silicon substrate. The devices must be electrically isolated to ensure that each device can be operated without interfering with adjacent devices. However, as the demands for smaller circuits with higher device density increase, the isolation regions between the devices must shrink in size. Smaller isolation regions, however, can be difficult to manufacture.

Conventionally, when manufacturing devices comprising dimensions of 350 nm or larger, a process known as local oxidation of silicon (LOCOS) is used to form isolation regions between the devices. However, a phenomenon known as bird's beak phenomenon that can result from a conventional LOCOS method will introduce current leakage between devices. Further, isolation regions manufactured by a conventional LOCOS method suffer uneven surfaces.

Shallow trench isolation (STI) was developed to address the limitations of the LOCOS method in manufacturing of devices with dimensions of 250 nm or smaller. A conventional shallow trench isolation process is described in conjunction with FIG. 1A to FIG. 1D. First, a pad oxide layer 102 and a silicon nitride layer 104 are sequentially formed on a substrate 100, as shown in FIG. 1A. Next, a trench 106 is first defined using conventional lithography techniques and then etched using conventional etching techniques to form a trench 106, as shown in FIG. 1B. In FIG. 1C, an oxide liner 108 is grown within trench 106 and then the trench 106 is filled with a dielectric material. Chemical mechanical polishing (CMP) is then performed using the silicon nitride layer 104 as a polish stop layer to remove the dielectric material deposited outside the trench 106, forming a dielectric layer 110. As shown in FIG. 1D, the silicon nitride layer 104 and pad oxide layer 102 are removed to form a shallow trench isolation structure 116.

Using the shallow trench isolation process described in FIG. 1A to FIG. 1D can provide better device isolation for devices comprising smaller dimensions; however, problems can still exist. For example, mismatch between the oxide liner 108 and the substrate 100 can occur as well as dislocation between oxide liner 108 and substrate 110.

FIG. 2A to FIG. 2B disclose a process for forming an alternative STI structure the first, an oxide liner 208 is formed inside the trench 206; however, a nitride liner 210 is also formed on the oxide liner 208 to solve the problem of mismatch between the oxide liner 208 and the substrate 200 as well as to help prevent dislocation. However, in the subsequent processing steps e.g., forming a gate oxide on a surface 212, the presence of nitride liner 210 can impede reactants, such as oxygen, and results in a thinning of the gate oxide formed near the STI structure. Consequently, to address the oxide thinning issue, an additional photo mask is needed and the lithography and etch techniques must be discreetly controlled to partially remove the nitride liner 210 to form the structure shown in FIG. 2B. However, since the nitride liner 210 is quite thin, it is difficult to accurately control the lithography and etch techniques and the process window is therefore very small.

Moreover, in conventional lithography techniques, a tradeoff between high resolution (R) and sufficient depth of focus (DOF) exists. Theoretically, light with a short wavelength and a larger numerical aperture (NA) is used to ensure that the resolution (R) obtained from the lithography technique is optimum. However, use of such light requires high cost exposure equipment. Further, high-throughput equipment for producing and using such light is often not available in the market. The large NA suffers from small DOF, and results in difficulties controlling the process. Therefore, as a result of the tradeoffs required, the structure in FIG. 2B manufactured by a conventional technique often suffers inconsistent device quality.

U.S. Pat. No. 6,180,493 describes another method for forming a shallow trench isolation region that attempts to resolve the above-mentioned problems. The method essentially discloses forming a shallow trench isolation region in a substantially oxygen-filled atmosphere, in which the shallow trench isolation region includes a plurality of insulating layers inside the trench. However, this method not only requires forming a plurality of insulating layers, buffer layers, and oxide liners, it also needs to control the thickness of these layers by tuning process parameters. Thus, this method is complicated, which can increase costs and reduce throughput.

Accordingly, there is a need for an improved method of forming a shallow trench isolation region that is not only cost effective, but also resolves the problem of dislocation and oxide thinning.

SUMMARY OF THE INVENTION

A simple and cost effective method for forming a shallow trench isolation region capable of solving the dislocation and oxide thinning issues. The methods disclosed allow for the formation of a shallow trench isolation region using a self-aligned lithography process that does not require additional photo masks or overlays. The amount of rework needed for repairing overlay error is therefore reduced.

In one aspect, a shallow trench isolation region(s) can be produced using exposure equipment having a large DOF and low R. Consequently, cost effective, high-throughput exposure equipment can be realized.

In another aspect, a shallow trench isolation region is formed using a self-align lithography process without an additional photo mask that facilitates nitride liner pull back and reduces the oxide thinning issue.

In still another aspect, a substrate is provided. Next, a pad oxide layer and a silicon nitride layer are sequentially formed on the substrate. The silicon nitride layer, the pad oxide layer, and the substrate are then partially etched to form a trench. An oxide liner and a nitride liner are sequentially formed in the trench. A photo resist layer is formed over the substrate and then, a self-align lithography process without photo mask is implemented to remove part of the photo resist layer over the silicon nitride layer and near the top of the trench. The rest of the photo resist layer remains inside the trench. Next, using the remaining photo resist as a mask, the nitride liner is etched to remove the top of the nitride liner.

In still another aspect, a stack structure is provided, wherein the stack structure includes a silicon nitride and defines an opening. Next, an oxide liner and a nitride liner are sequentially formed in the opening. A photo resist layer is formed over the nitride liner and the silicon nitride. An exposure step is implemented to expose the photo resist layer near the top of the opening, and then a development step is implemented to remove the photo resist layer near the top of the opening. Using the remaining photo resist as a mask, the top of the nitride liner is then etched.

During the exposure step, an exposure light source is used, in which the energy of the light source is about 100 to 140 mJ, or the wavelength of the exposure light source is about 3650 angstrom.

The exposure step is implemented using exposure equipment that provides a resolution with a value of 0.4 µm.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the feature, advantages, and principles of the invention.

DETAILED DESCRIPTION OF PREFERRED EMBODIMENTS

FIGS. 3A to 3F are schematic, cross-sectional views showing the manufacturing processes of forming a shallow trench isolation region in accordance with an embodiment of the present invention.

Figure 1A:
FIGS. 1A-1D are schematic, cross sectional views showing the progression of manufacturing steps according to a conventional method of forming a STI structure in a substrate.
Figure 1B:
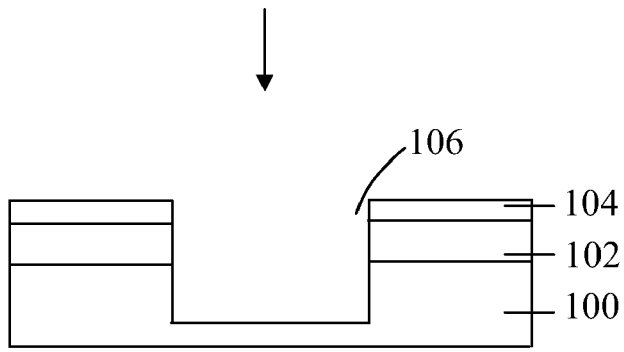
Figure 1C:
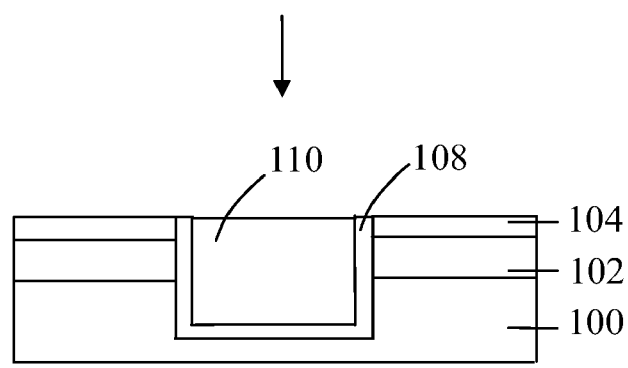
Figure 1D:
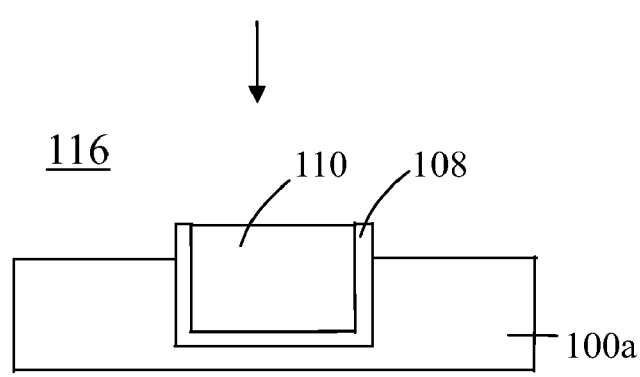
Figure 2A:
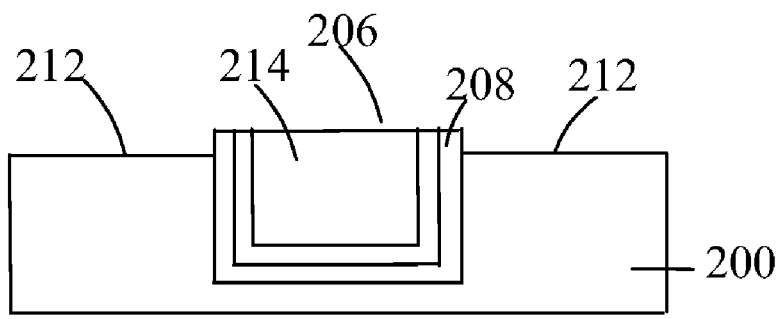
FIGS. 2A-2B are schematic, cross sectional views showing the progression of manufacturing steps according to another conventional method of forming a STI structure in a substrate.
Figure 2B:
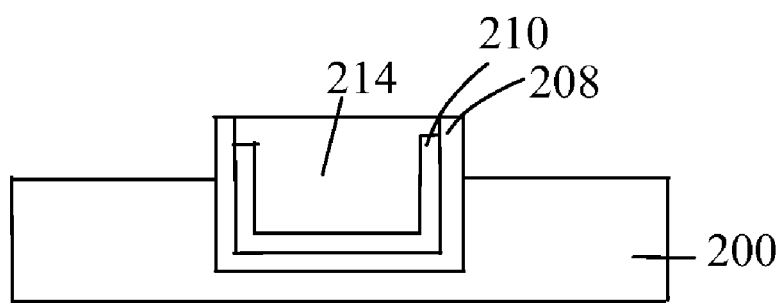
Figure 3A:
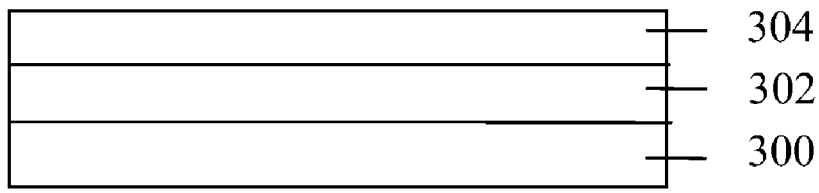
FIGS. 3A-3F are schematic, cross sectional views showing the progression of manufacturing steps according to a method of forming a STI structure in a substrate according to one embodiment.

Referring to FIG. 3A, a substrate 300 is provided. A pad oxide layer 302 is formed on the substrate 300 using a conventional technique, such as a thermal oxidation method, to protect the surface of the substrate 300. Next, a silicon nitride layer 304 is formed on the pad oxide layer 302 using a chemical vapor deposition method or other proper methods. Due to its resistance against vapor and oxygen penetration, the silicon nitride layer 304 can prevent an underlying region (active region) from oxidation. Due to the differences in etch rate between silicon nitride and silicon dioxide, the silicon nitride layer 304 acts as a hard mask and an etch stop layer when the pad oxide layer 302 and the substrate 300 are etched. This is so called etch selectivity.

Figure 3B:
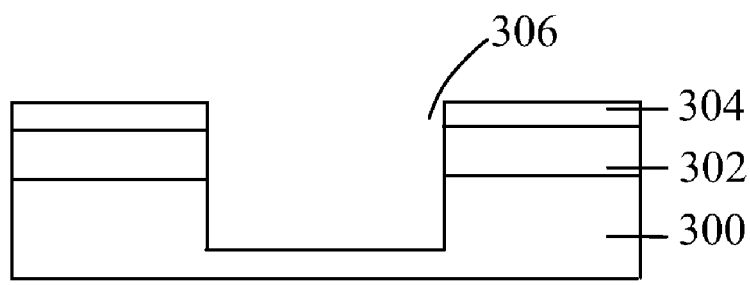

As seen in FIG. 3B, after the silicon nitride layer 304 is formed, it is patterned to define the position and range of a trench 306 to be etched. The silicon nitride layer 304 is patterned using conventional techniques, such as conventional lithography and etch techniques. For example, a photo resist layer (not shown) is first formed over the silicon nitride layer 304, the silicon nitride layer 304 is then etched and the photo resist layer is stripped to complete the patterning process of the silicon nitride layer 304. Due to the differences in materials between the silicon nitride layer 304, the pad oxide layer 302 and the substrate 300, the pad oxide layer 302 and substrate 300 are etched by anisotropic etch, such as dry etch, in which the silicon nitride layer 304 acts as a hard mask and an etch stop layer to form the trench 306.

Figure 3C:
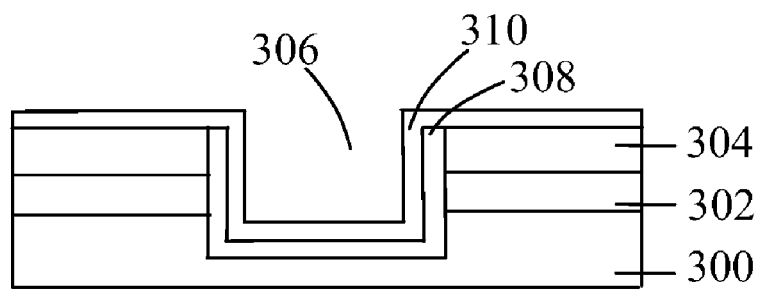

Next, as illustrated in FIG. 3C, utilizing thermal oxidation or chemical vapor deposition, for example plasma enhanced chemical vapor deposition (PECVD) or high density plasma chemical vapor deposition (HDP CVD), an oxide liner 308 is formed in the trench 306 to eliminate the damages that substrate 300 suffers from etch. To address the mismatch between the oxide liner 308 and the underlying substrate 300 and other dislocation issue, the present invention utilizes chemical vapor deposition or other proper methods to deposit nitride on the oxide liner 308, such that a nitride liner 310 is formed on the oxide liner 308. In a preferred embodiment, the material of the oxide liner 308 is silicon dioxide and the material of the nitride liner 310 is silicon nitride.

Figure 3D:
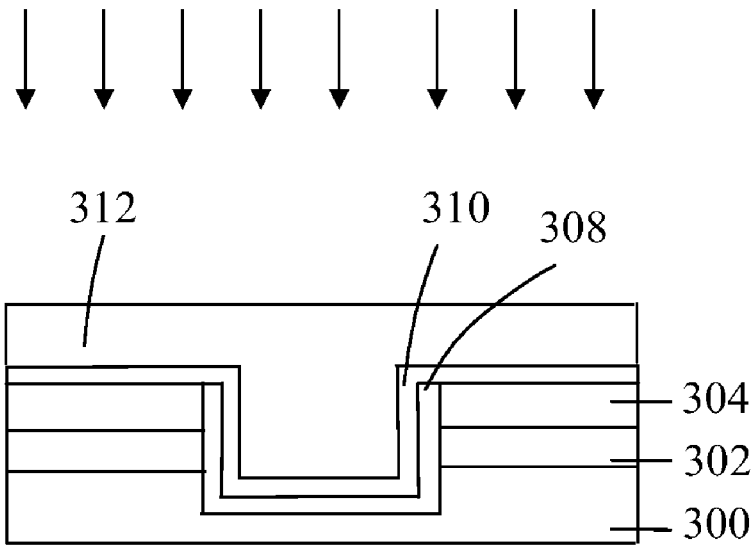
Figure 3E:
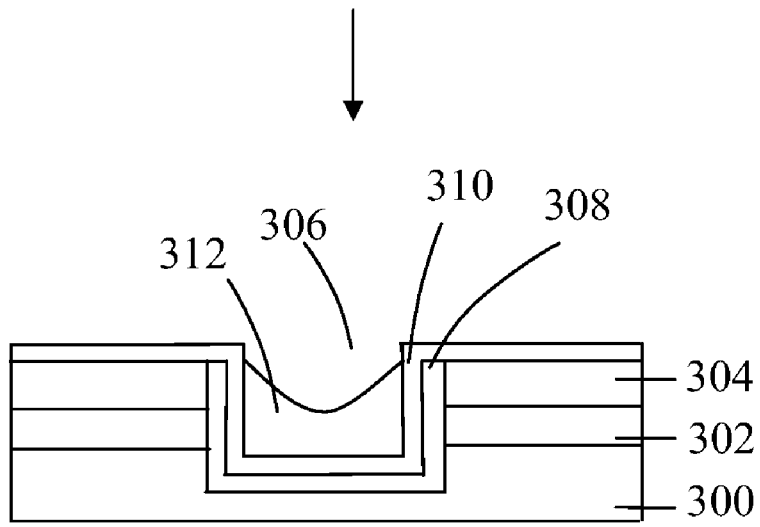

A self-aligned lithography process without photo mask is then implemented. The self-aligned lithography process includes a photo resist coating, a soft bake, an exposure step and a development step. First, a typical photo resist coating method, such as spin-on coating, is used to apply a photo resist on the upper surface of the resulting structure of FIG. 3C. This forms a photo resist layer 312, as shown in FIG. 3D. Next, a soft bake process is implemented to drive off solvents in the photo resist layer 312, and the liquid photo resist is transformed to a solid state, which improves the adhesion of the photo resist layer 312. Next, the exposure step is implemented using exposure equipment, in which the arrowhead shown in FIG. 3D is the path of the light. The portion of photo resist layer 312 over the silicon nitride layer 304 and on the top of the trench 306 is exposed and the remainder of the photo resist layer 312 inside the trench 306 is unexposed. This is accomplished by changing the material of the photo resist layer 312, the wavelength of the light source of the above-mentioned exposure equipment, an exposure time, R and/or the exposure focus center. After the subsequent development step, the portion of photo resist layer 312 over the silicon nitride layer 304 and on the top of the trench 306 is removed and the portion of photo resist layer 312 inside the trench 306 remains, as shown in FIG. 3E.

Conventionally, there is a tradeoff between high resolution (R) and sufficient depth of focus (DOF) when using conventional lithography techniques. Here, however, a large DOF and low R are achieved simultaneously. For example, exposure equipment with resolution (R) larger than a diameter of the trench 306 may be used. Silicon nitride layer 304 acts as an optical mask, and the light generated from the light source of the exposure equipment is diffracted near the top of the trench 306, exposing the portion of the photo resist layer 312 over the silicon nitride layer 304 and on the top of the trench 306. The portion of the photo resist layer 312 inside the trench 306 is unexposed, as shown in FIG. 3E. The resolution (R) provided by the exposure equipment can be expressed as the following formulation (Rayleigh formulation):

$R = k1 \cdot \lambda / NA$, in which, R is resolution, k1 is constant, λ is the wavelength of the light source and NA is the numerical aperture value of a lens of the exposure equipment.

It will be understood that the wavelength (λ) of the light source can be adjusted and/or exposure equipment with suitable numerical aperture (NA) value can be used to ensure that the resolution provided by the exposure equipment is larger than the diameter of the trench 306. In a preferred embodiment, an i-line lithography system is used, in which the wavelength of the light source is about 3650 angstrom, the numerical aperture value (NA) is 0.5, k1 is 0.1, and the resolution (R)

is about 0.47 µm. Thus, the trench 306 cannot be resolved by the exposure equipment since the diameter of the trench 306 (about 0.4 µm in general) is smaller than the resolution of the exposure equipment (0.47 µm). As a result, partial photo resist layer 312 over the silicon nitride layer 304 and on the top of the trench 306 is exposed, and the rest of photo resist layer 312 inside the trench 306 is unexposed.

In an alternative embodiment, non-exposure of the portion of photo resist 312 inside trench 306 can be achieved by controlling the energy of the light source. For example, the range of the energy of the light source can be 100-140 mJ. In general, it will be understood that non-exposure of the portion of photo resist 312 inside trench 306 can be achieved by tuning the process parameters, or by selecting the material of the photo resist layer 312.

The remainder of photo resist layer 312 is then used as a mask during etching of the nitride liner 310. It should be noted that the depth of the exposed photo resist layer 312 inside the trench 306 is preferably shallow and needs to be discreetly controlled to ensure that merely the nitride liner 310 on the top of the trench 306 is etched in the etching step to follow. In a preferred embodiment, this can be accurately achieved by controlling the wavelength of the light source ($\lambda$), the energy of the light source, by using exposure equipment with suitable numerical aperture (NA) value, and by using suitable photo resist material, to ensure that the portion of photo resist layer 312 on the top of the trench 306 is exposed and the rest of the photo resist layer inside the trench 306 is unexposed.

Next, the development step is implemented. Since the portion of resist layer 312 on the silicon nitride 310 and on the top of the trench 306 is exposed, and the rest of the photo resist layer 312 inside the trench 306 is unexposed, the portion of photo resist layer 312 over the silicon nitride layer 304 and on the top of the trench 306 is removed and the rest of photo resist layer 312 inside the trench 306 will remain in the subsequent development step, as shown in FIG. 3E. The developer used in the development step depends on the material of the photo resist layer 312. In an embodiment, the photo resist layer 312 is a positive photoresist, and the developer is selected from one of the base solution including sodium hydroxide and potassium hydroxide. The material of the photo resist layer 312 is transformed to carboxylic acid after the exposure step, and the transformed material can be dissolved in the base solution of the developer during the development step.

In another embodiment, some steps of the process illustrated in FIG. 3A-3E can be eliminated. For example, after forming the structure shown in FIG. 3C, the deposition of the photo resist can be well-controlled, such that the trench 306 is partially filled with the photo resist to form the photo resist layer 312 within the trench 306 as shown in FIG. 3E.

As shown in FIG. 3E, the photo resist layer 312 acts as a mask during the subsequent nitride liner pull back process. During the nitride liner pull back process, only the nitride liner 310 on the top of the trench 306 is removed and a greater part of the nitride liner 310 inside the trench 306 remains. By removing the top of nitride liner 310, the oxide thinning issue can be overcome. Further, the nitride liner 310 inside the trench 306 can help prevent dislocation.

Figure 3F:
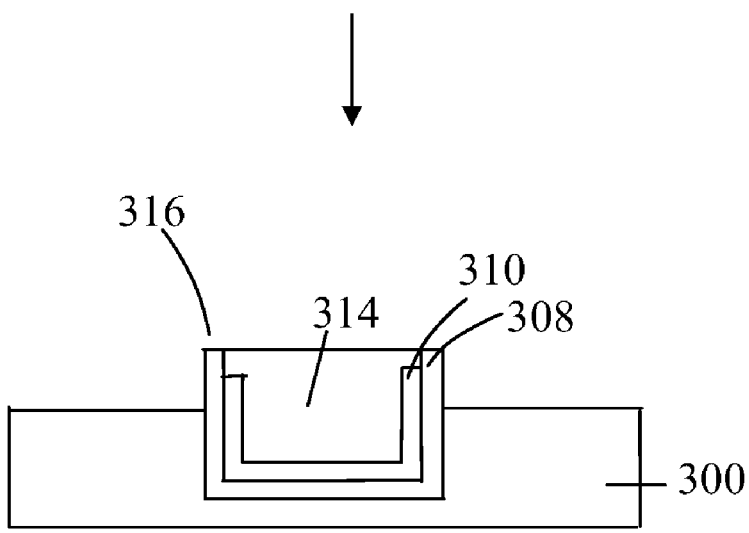

The portion of photo resist layer 312 inside the trench 306 is then stripped using conventional methods, such as dry strip and wet strip. Then, utilizing chemical vapor deposition, such as plasma enhanced chemical vapor deposition (PECVD) or high density plasma chemical vapor deposition, the trench 306 is filled with a dielectric material. The nitride liner 310 and excess dielectric material deposited outside the trench 306 can then be removed by chemical mechanical polish (CMP) and a dielectric layer 314 is therefore formed inside the trench 306. Next, the nitride layer 304 and the pad oxide layer 302 are stripped and a shallow trench isolation structure 316 shown in FIG. 3F is formed, in which the shallow trench isolation structure 316 includes the nitride liner 310, the oxide liner 308 and the dielectric layer 314 inside the trench 306. The oxide thinning issue, which may occur during the subsequent formation of the gate oxide can be reduced as a result of the structure of FIG. 3F.

According to the self-align lithography process of the present invention, an additional mask or overlay needed in conventional lithography techniques is not necessary. As a result, cost effective exposure equipment with high throughput can be used. Photo resist layer 312 remains inside the trench 306 by controlling the process condition, and the top of nitride liner 310 can be pulled back to avoid oxide thinning.

Referring to the structure shown in FIG. 3F, the nitride liner 310 formed on the oxide liner 308 also reduces the dislocation between the oxide liner 308 and the underlying substrate 300 and prevents other dislocation issues. The self-align lithography process is implemented to etch partial nitride liner 310, i.e. top of the nitride liner 310, and the trench 306 is then filled with the dielectric material, and thereby the shallow trench isolation structure 316 is formed. The oxide thinning issue that can occur during the subsequent step of forming the gate oxide can be reduced based on the structure of the shallow trench isolation region 316.

Although the invention has been described with reference to the preferred embodiments, it will be understood that the invention is not limited to the details described thereof. Substitutions and modifications have been suggested in the foregoing description, and others will occur to those of ordinary skill in the art. In particular, the process steps of the method according to the invention will include methods having substantially the same process steps as the method of the invention to achieve substantially the same result. Therefore, all such substitutions and modifications are intended to be within the scope of the invention as defined in the appended claims and their equivalents.

I claim:

1. A method for forming a shallow trench isolation region, comprising:
    providing a substrate;
    forming a pad oxide layer and a silicon nitride layer on the substrate sequentially;
    forming a trench in the substrate;
    forming an oxide liner and a nitride liner in the trench sequentially;
    forming a photo resist layer over the substrate;
    performing a self-align lithography process to remove part of the photo resist layer over the silicon nitride layer and near the top of the trench; and
    utilizing the remaining photo resist as a mask to etch the nitride liner as to remove the top of the nitride liner,
    wherein the self-align lithography process is performed without any photo mask and exposure equipment used during the self-align lithography process has a resolution (R) that is larger than a diameter of the trench.

2. The method of claim 1, wherein the self-align lithography process includes:
    performing an exposure step to expose the photo resist layer over the silicon nitride layer and near the top of the trench; and
    performing a development step to remove the photo resist layer over the silicon nitride and inside the trench.

3. The method of claim 2, wherein an exposure source is used during the exposure step, and the energy of the exposure source is in the range of 100-140 mJ.

4. The method of claim 2, wherein an exposure source is used during the exposure step, the wavelength of the exposure source is about 3650 angstrom.

5. The method of claim 1, wherein the step of forming the trench is performed by lithography and etch techniques.

6. The method of claim 1, wherein the oxide liner is silicon dioxide and forming the oxide liner in the trench is performed by chemical vapor deposition.

7. The method of claim 1, wherein the nitride liner is silicon nitride and forming the nitride liner in the trench is performed by chemical vapor deposition.

8. A method for forming a shallow trench isolation region, comprising:
   providing a stack structure, wherein the stack structure includes a silicon nitride layer and defines an opening;
   forming an oxide liner and a nitride liner in the opening sequentially;
   forming a photo resist layer over the nitride liner and the silicon nitride;
   performing an exposure step to expose the photo resist layer near the top of the opening;
   performing a development step to remove the photo resist layer near the top of the opening; and
   utilizing the other photo resist as a mask and etching the nitride liner near the top of the nitride liner,
   wherein exposure equipment used during the exposure step has a resolution (R) that is larger than a diameter of the opening.

9. The method of claim 8, wherein an exposure source is used during the exposure step, and the energy of the exposure source is in the range of 100-140 mJ.

10. The method of claim 8, wherein an exposure source is used during the exposure step, the wavelength of the exposure source is about 3650 angstrom.

11. The method of claim 8, wherein the stack structure further comprises a pad oxide.

12. The method of claim 8, wherein the oxide liner is silicon dioxide and forming the oxide liner in the trench is performed by chemical vapor deposition.

13. The method of claim 8, wherein the nitride liner is silicon nitride and forming the nitride liner in the trench is performed by chemical vapor deposition.

14. The method of claim 8, wherein part of the photo resist layer remains over the trench after performing the development step.

* * * * *